April 18, 1961 F. S. STEIN ET AL 2,980,832
HIGH CURRENT NPNP SWITCH
Filed June 10, 1959 2 Sheets-Sheet 1
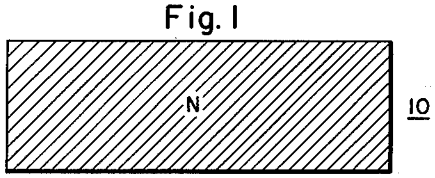
Fig. I
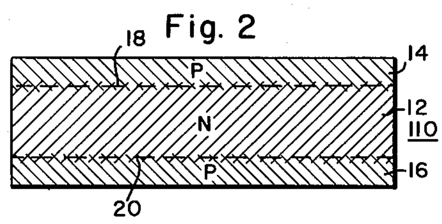
Fig. 2
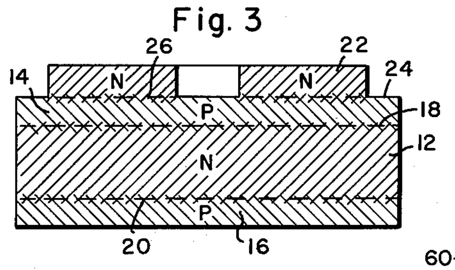
Fig. 3
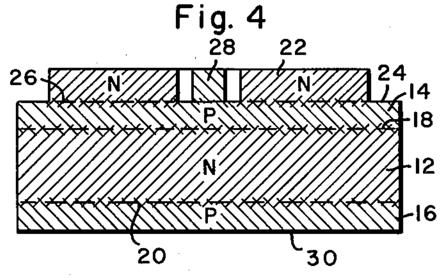
Fig. 4
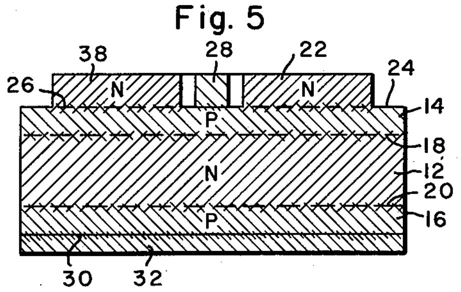
Fig. 5
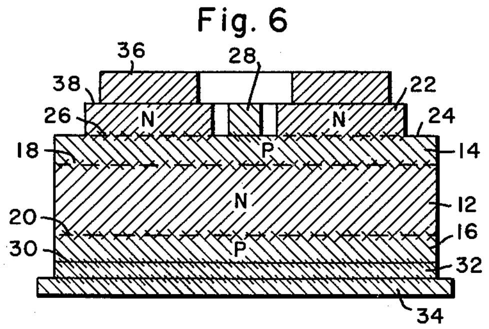
Fig. 6
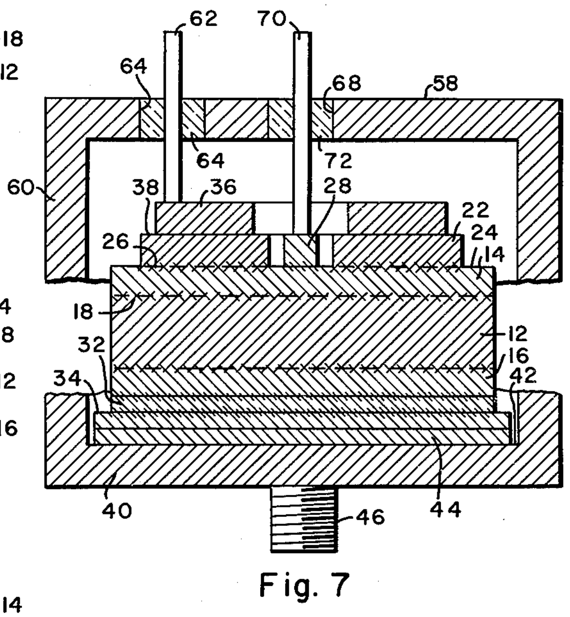
Fig. 7
WITNESSES
John E. Healey, Jr.
Charles L. Menzemer
INVENTORS
Frank S. Stein &
Elmer W. Torok
BY
Frederick Shapoe
ATTORNEY United States Patent Office 2,980,832
Patented Apr. 18, 1961

2,980,832

HIGH CURRENT NPNP SWITCH

Frank S. Stein and Elmer W. Torok, Greensburg, Pa., assignors to Westinghouse Electric Corporation, East Pittsburgh, Pa., a corporation of Pennsylvania Filed June 10, 1959, Ser. No. 819,307

8 Claims. (Cl. 317—235)

This invention relates to a multi-junction three terminal semiconductor switching device.

An object of the present invention is to provide a three terminal, multi-junction, semiconductor switching device in which the breakover voltage can be controlled by the base current.

Another object of the present invention is to provide a high-current, three-terminal, PNPN semiconductor switching device comprising (1) a wafer of a semiconductive material having a first and second region of a first type of semiconductivity (such being either p or n) separated by a region of a second type of semiconductivity, (2) a p-n junction between each of the regions of first type semiconductivity and the region of second type semiconductivity, (3) an emitter disposed upon one surface of one region of the first type semiconductivity, (4) a p-n junction between the emitter and the region of first type semiconductivity and (5) means for making electrical connections to each of the regions of first type semiconductivity and to the emitter.

Other objects will, in part, be obvious and will, in part, appear hereinafter.

For a better understanding of the nature and objects of the invention, reference should be had to the following detailed description and drawings in which:

Fig. 1 is a side view in cross section of a wafer of semiconductive material;

Figs. 2 through 6 inclusive are side views in cross section of the wafer of Fig. 1 undergoing various treatments in accordance with the teachings of this invention;

Fig. 7 is a side view in cross section of a semiconductor switching device prepared in accordance with the teachings of this invention;

Figure 8:
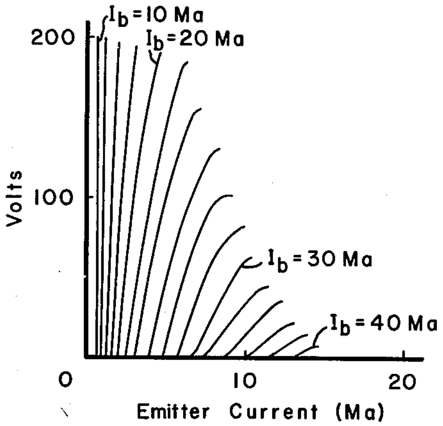
Fig. 8 is a graphical representation of the forward voltage and current characteristics in the "off" or blocking state of the device of this invention.

In accordance with the present invention and attainment of the foregoing objects there is provided a high-current three terminal PNPN or NPNP semiconductor switching device comprising (1) a single crystal wafer of a semiconductive material having a first and a second region of a first type semiconductivity (each being either p or n) separated by a region of a second type semiconductivity, said second type region having two parallel surfaces, the first and second regions of first type semiconductivity each having one surface contiguous and coextensive with one of the parallel surfaces of said region of second type semiconductivity, (2) a p-n junction between each of the regions of first type semiconductivity and the region of second type semiconductivity, (3) an emitter of second type semiconductivity fused to another surface of the first region of first type semiconductivity, (4) a p-n junction between the emitter and the first region, (5) a base contact ohmically attached to the same surface of the first region as the emitter, (6) an ohmic solder fused to another surface of the second region of first type semiconductivity, and (7) means for making electrical connections to each of the regions of first type semiconductivity and to the emitter.

For the purpose of clarity, the present invention will be described specifically in terms of a NPNP silicon device. It will, however, be understood that the invention is applicable in a similar manner to produce PNPN devices. The semiconductive material employed may be silicon, germanium, silicon carbide or a stoichiometric compound comprised of elements from Group III of the Periodic Table, for example gallium, aluminum and indium, and elements from Group V, for example arsenic, phosphorus and antimony. Examples of suitable III–V stoichiometric compounds include gallium arsenide, gallium antimonide, indium arsenide and indium antimonide.

With reference to Fig. 1, there is illustrated a single crystal silicon wafer 10 of n-type semiconductivity. The wafer 10 may be prepared by any of the methods known to those skilled in the art. For example, a single-crystal silicon rod may be pulled from a melt comprised of silicon and at least one element from Group V of the Periodic Table, for example arsenic, antimony or phosphorus. The wafer 10 is then cut from the rod with, for example, a diamond saw. The surfaces of the wafer may then be lapped or etched or both to produce a smooth surface after sawing. It has been discovered that the best devices prepared in accordance with this invention are prepared employing a wafer with (111) cystal orientation at the surfaces.

The wafer 10 is then disposed in a diffusion furnace. The hottest zone of the furnace is at a temperature within the range of 1100° C. to 1250° C. and has an atmosphere of the vapor of an acceptor doping material, for example, indium, gallium, aluminum, or boron. The zone of the furnace within which a crucible of said acceptor impurity lies may be at a temperature of from 600° C. to 1250° C., the specific temperature being chosen to ensure the desired vapor pressure and surface concentration of diffusant from the crucible. The acceptor impurity diffuses into the n-type crystal. Since the acceptor impurity will normally diffuse through all sides of the wafer it is necessary to mask the sides and other surfaces, with, for example, Apiezon wax or the like, through which no diffusion is desired.

With reference to Fig. 2, there is illustrated a wafer 110 which is the n-type wafer of Fig. 1 after diffusion in which doping impurities diffused only into the parallel top and bottom surfaces. The wafer 110 is comprised of a central n-type region 12, a top p-type region 14, and a bottom p-type region 16. There is a p-n junction 18 between regions 12 and 14 and a p-n junction 20 between regions 12 and 16.

Region 14 must be deep enough to permit the fusion of additional contacts therewith without penetrating through to the n-type region 12, and to permit a low impurity concentration gradient to be achieved by the diffusion operation at the interface between regions 12 and 14 which will result in a high breakover voltage. The region 14 should not be so deep, however, as to substantially increase the forward voltage drop of the finished semiconductor device. A depth or thickness of from 0.75 mil to 2.5 mils for the region 14 has been found satisfactory for the devices of this invention.

Region 12 must be deep enough so as not to limit the voltage-breakover by premature punchthrough. The depth of region 12 is also dependent upon the resistivity of the material. The thickness (T) of region 12 may be determined by the equation:

$$T = K\sqrt{P_n V_{PT}}$$

wherein:

$T$=Thickness in mils
$K$=A constant depending on the material which is approximately, $K = 1.4\times10^{-7}$ for n-type silicon
$K = 8\times10^{-8}$ for p-type silicon
$P_n$=Resistivity of the n-type material in ohm-cm. (For p-type silicon, its resistivity is employed)
$V_{PT}$=Punchthrough voltage A thickness or depth of from 3 to 5 mils has been found satisfactory for the device of this invention using a good grade n-type silicon.

The thickness or depth of region 16 is not critical. From a practical standpoint it is usually equal to the thickness of region 14, but may be more or somewhat less, depending upon design considerations.

While it is possible to establish regions 14 and 16 by alloying rather than diffusion, it has proven to be simpler and more convenient to employ diffusion, especially with respect to layer 14.

With reference to Fig. 3, an emitter 22 of n-type semiconductivity is then formed by disposing a donor doping material or alloy, preferably in the form of a foil having a thickness of about from 0.75 mil to 2.0 mils, upon surface 24 of region 14 and fusing the foil to the p-type region by heating in a vacuum or inert atmosphere, for example an argon or helium atmosphere at a temperature of from 650° C. to 750° C. Care must be taken that emitter 22 does not penetrate through region 14 to region 12.

Examples of suitable doping materials or alloys of which the emitter may be comprised include arsenic and antimony, and alloys thereof, and alloys of gold and antimony or arsenic. For instance, a foil of an alloy comprising 99.5%, by weight, gold and 0.5%, by weight, antimony is suitable. An emitter of an annular configuration is illustrated in Fig. 3, however, a circular or rectangular configuration would be equally satisfactory.

A p-n junction 26 is formed between region 14 and the emitter 22 during the fusion of the emitter 22 to surface 24 of p-type region 14.

With reference to Fig. 4, a base contact 28 is applied to a predetermined position upon surface 24 of the p-type region 14. The contact 28 is disposed at the center point of the area circumscribed by the annular emitter 22. The base contact 28 is comprised in part of at least one element of Group III of the Periodic Table, for example boron, aluminum, gallium, and indium, having p-type doping characteristics, the remainder, if any, being a neutral metal. The contact 28 may also be comprised of an alloy, for example, a 99% gold-1% boron, gold-gallium, silver-tin-indium, or 90% silver-10% indium alloy. The contact 28, which may be in the form of a pellet, foil or the like is disposed upon surface 24 and fused thereto by heating in a vacuum or inert atmosphere, for example, a vacuum having an absolute pressure of from $10^{-2}$ to $10^{-5}$ mm. Hg, or for example an argon or helium atmosphere.

As illustrated in Fig. 5, a layer 32 of an alloy having p-type or acceptor doping characteristics is then joined to surface 30 of p-type region 16 by fusion. The acceptor alloy of layer 32 is similar to that of contact 28, being comprised of at least one element of Group III of the Periodic Table, for example, boron, aluminum, gallium and indium. The alloy 32 may be in the form of a foil or the like.

Thereafter, metallic ohmic electrical contacts, for example, contacts of molybdenum, tungsten, tantalum and base alloys thereof may be joined to the device to facilitate the making of subsequent additional electrical connections thereto. For example, and with reference to Fig. 6, a contact 34 of disc shape, comprised of, for example, molybdenum, tungsten, tantalum and base alloys thereof, may be fused to the bottom surface of the layer 32 of the acceptor alloy. The contact 34 may be coextensive with or larger than the layer 32. Another contact 36 of annular form, comprised of, for example, molybdenum, tantalum, tungsten and base alloys thereof, may be joined by soldering or brazing or the like to the upper surface 38 of the emitter 22. The contact 36, for most satisfactory results, should be of the same configuration as the emitter 22 but slightly smaller so as not to overlap the emitter at either its inside or outside periphery.

The NPNP switching device thus prepared is then hermetically sealed, for example, in a metal container, to protect it from the ambient atmosphere. With reference to Fig. 7, the device is enclosed within and joined to the bottom of a metal container which is comprised of a bottom portion 40 and a top portion 60 (only fragments of which are shown) by soldering the metal contact 34 to an inner bottom surface 42 of the bottom portion 40 with a layer of solder 44. The bottom portion 40 of the container may have a threaded stud 46 disposed on one surface thereof and integral therewith to facilitate the connecting of the device in an electrical circuit.

The top portion 60 of the container has an upper surface 58 which contains glass plugs 64 and 68. An electrical contact 62 passes through the glass plug 64 and is joined to the emitter contact 36. An electrical contact 70 passes through glass plug 68 and is joined to the base contact 28.

The metal container 40 may be comprised of any suitable metal or alloy, for example, brass, copper, steel, aluminum and the like. In addition to protecting the device from the ambient atmosphere the container may also serve to remove heat, generated during operation of the device, from the device.

Suitable solders which may be used to join the contact to the container 34 include any silver base solder, for example, a silver-lead-tin solder.

The surface of the contact 34 joined to the container 40 may be coated or sintered with a metal, for example nickel, to facilitate the wetting thereof by the solder 44.

In a modification of the teachings of this invention, the assembled semiconductor switching device may be encapsulated in a resin, for example, a silicone or epoxy resin rather than being hermetically sealed in a metal container.

It will be understood that the order of the above steps leading to the formation of the semiconductor device incorporating the teachings of this invention is not critical and is set forth as above only for purposes of illustration. It will be further understood, that in the assembly of this device it is possible to carry out two or more of the fusion or other steps in one operation. The following specific example is illustrative of the practice of this invention.

*Example I*

A flat circular wafer of single crystal n-type silicon having a (111) surface orientation and a resistivity of from 10 to 100 ohm-cm., and of a diameter of ⅜ inch and a thickness of 8 mils, was coated about its circular edge with an organic wax. The wafer was then disposed in a diffusion furnace. The diffusion furnace was at a maximum temperature of 1200° C. and had a gallium vapor atmosphere. The gallium was allowed to diffuse through the flat parallel surfaces of the wafer to a depth of 2 mils. The wafer was then removed from the diffusion furnace, and the wax stripped from the circular edge.

Thereafter, a foil of annular configuration having an outer diameter of 5/16 inch and an inner diameter of 0.09 inch and comprised of 99.5% by weight gold and 0.5% by weight antimony, and a thickness of 0.0015 inch, was disposed upon one surface of the p-type region as shown in Fig. 3. A circular p-type base contact having a diameter of 1/16 inch and comprised of gold with a few hundreds percent of boron and having a thickness of 0.0015 inch was disposed upon the same surface of the wafer at the center of the area circumscribed by the annular emitter. The wafer with the emitter and base contact disposed thereon was then heated to a temperature of approximately 700° C. whereby the emitter and base contact were fused to the wafer.

During this operation a molybdenum contact having a thickness of 0.02 inch and a diameter of 3/8 inch was simultaneously soldered to the opposite face of the silicon wafer with an acceptor alloy comprised of a boron doped aluminum foil having a thickness of approximately 0.002 inch. The lower surface of the molybdenum contact had a 0.001 inch thick plating of nickel thereon. The metallic contact was subsequently soldered to a copper case member with a silver-lead-tin solder.

An annular molybdenum ring was soldered to the upper surface of the emitter with a silver-lead-tin solder. The device thus prepared was found to have the following characteristics:

(1) Breakover voltage of up to 900 volts.
(2) Breakover current of from 0.1 to 25 milliamperes.
(3) A base firing current of from 5 to 300 milliamperes.
(4) A forward drop of 1.0 to 1.5 volts at 20 amps. and about 0.1 volt higher at 50 amps.
(5) A delay time and a rise time of a few tenths of a microsecond-independent of the load current.
(6) A storage time of a few microseconds at one amp.
(7) Recovery time of 10 to 20 microseconds at one amp.
(8) A thermal drop measured junction to case base of 0.4 to 1.0° C. per watt.
(9) A reverse voltage of up to 900 volts or greater.

With reference to Fig. 8, the blocking characteristics of the device of this invention are graphically illustrated with base firing current as a parameter. Fig. 8 illustrates the control function of the base current, $I_b$. It is apparent from Fig. 8 that at low emitter currents the impedance is high corresponding to the "off" condition of the switch. At higher currents the blocking voltage breaks over and the switch becomes a low impedance device; this is the "on" condition. The breakover voltage, and to a smaller extent the breakover current, are controlled by the magnitude of the base current.

Figure 9:
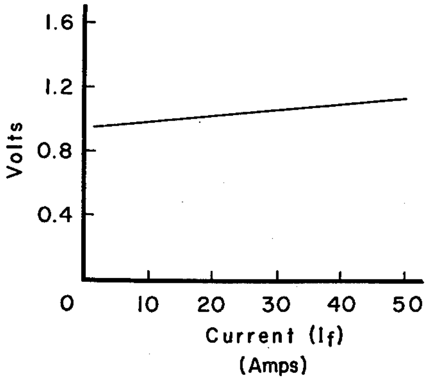
Fig. 9 is a graphical presentation of the direct current forward characteristics in the "on" state, of a device prepared in accordance with the teachings of this invention.

The I–V forward on or firing characteristics of the device of this invention are graphically illustrated in Fig. 9. The curve refers to a steady direct current value of current and voltage. The forward drop is about 1 volt at 20 amperes, with a temperature rise of the base member above ambient of 28° when convection-cooled on a 6 x 6 x 1/8 inch blackened copper fin; and about 1.1 volt at 50 amps. with a temperature rise of 77° for the same mounting plate. At 20 amperes, the forward resistance is shown to be 0.05 ohm, and at 50 amperes only about 0.02 ohm. The differential resistance is a few thousandths of an ohm. The low forward drop in the "on" state of the device of this invention provides the device with a very high efficiency.

Figure 10:
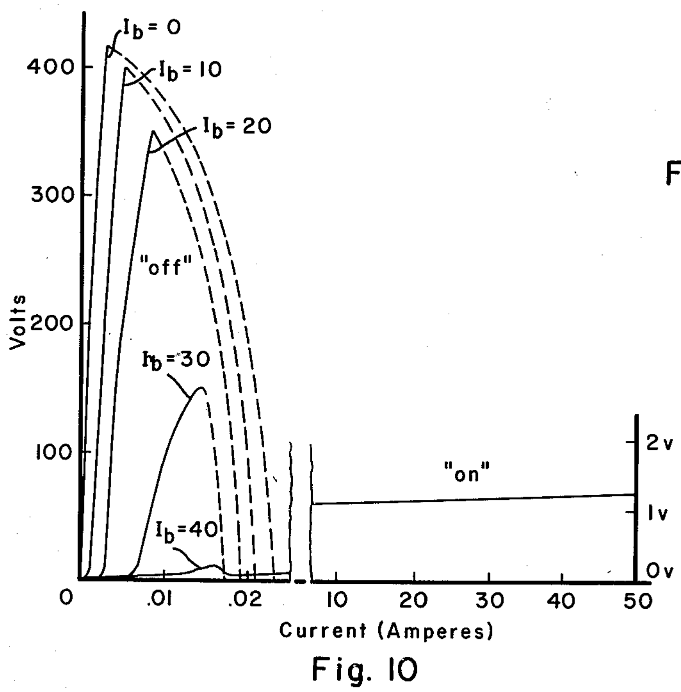
Fig. 10 is a graphical representation of the first quadrant switching characteristics of a device prepared in accordance with the teachings of this invention.

Relatively complete first quadrant switching characteristics of the device of this invention are illustrated in Fig. 10. Fig. 10 is a combination of Fig. 8 and Fig. 9 in one graph illustrating the various I–V forward characteristics in relationship with various base firing current $I_B$.

Figure 11:
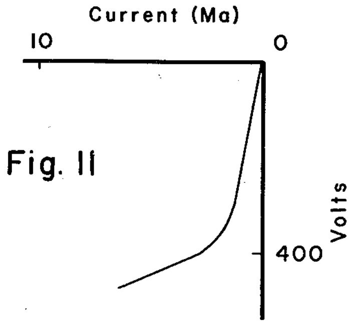
Fig. 11 is a graphical representation of I–V reverse or third quadrant characteristics of the device of this invention.

Fig. 11 illustrates the reverse quadrant characteristics of the device of this invention, and is included only to give a complete picture of the characteristics of this device.

While this invention has been described in terms of preparing a NPNP semiconductor switching device, it will be appreciated that the device of this invention may find use as a converter, inverter, frequency changer, variable frequency generator, motor control, voltage regulator, or high powered modulator and may be used to replace magnetic amplifier relays, and thyratrons in many circuits.

While the invention has been described with reference to particular embodiments and examples, it will be understood that modifications, substitutions and the like may be made therein without departing from its scope.

We claim as our invention:

1. A high-current three terminal PNPN semiconductor switching device comprising (1) a single crystal wafer of a semiconductive material having a first and a second region of a first type semiconductivity separated by a region of a second type semiconductivity having two parallel surfaces, the first and second regions of first type semiconductivity each having one surface contiguous and coextensive with one of the parallel surfaces of said region of second type semiconductivity, (2) a p-n junction between each of the regions of first type semiconductivity and the region of second type semiconductivity, (3) an emitter of second type semiconductivity fused to another surface of the first region of first type semiconductivity, (4) a p-n junction between the emitter and the said first region, (5) a base contact affixed to the same surface of the first region as the emitter, (6) an ohmic solder fused to another surface of the second region of first type semiconductivity, and (7) means for making one electrical connection to each of the regions of first type semiconductivity and to the emitter.

2. A high-current three terminal PNPN semiconductor switching device comprising (1) a single crystal wafer of silicon having a first and a second region of a first type semiconductivity separated by a region of a second type semiconductivity, the first and second regions of first type semiconductivity each having one surface contiguous and coextensive with opposite parallel surfaces of said region of second type semiconductivity, the first region of first type semiconductivity having a thickness of from 0.75 mil to 2.5 mils and the region of second type semiconductivity having a thickness of from 3 mils to 5 mils, (2) a p-n junction between each of the regions of first type semiconductivity and the region of second type semiconductivity, (3) an annular emitter of second type semiconductivity fused to another surface of the first region of first type semiconductivity, (4) a p-n junction between the emitter and the first region, (5) a base contact fused to the same surface of the first region as the emitter and centrally disposed within the area circumscribed by the emitter, (6) an ohmic solder fused to another surface of the second region of first type semiconductivity, and (7) means for making electrical connections to each of the regions of first type semiconductivity and to the emitter.

3. A high-current three terminal PNPN semiconductor switching device comprising (1) a wafer of silicon having a first and a second region of a first type semiconductivity separated by a region of a second type semiconductivity, the first and second regions of first type semiconductivity each having one surface contiguous and coextensive with opposite parallel surfaces of said region of second type semiconductivity, the first region of first type semiconductivity having a thickness of from 0.75 mil to 2.5 mils and the region of second type semiconductivity having a thickness of from 3 mils to 5 mils, (2) a p-n junction between each of the regions of first type semiconductivity and the region of second type semiconductivity, (3) an annular emitter of second type semiconductivity fused to another surface of the first region of first type semiconductivity, (4) a p-n junction between the emitter and the first region, (5) a base contact fused to the same surface of the first region as the emitter and centrally disposed within the area circumscribed by the emitter, (6) one surface of a metallic contact electrically joined to another surface of the second region of first type semiconductivity, and (7) an ohmic solder disposed between said metallic contact and said another surface of the second region and joining one to the other.

4. A high-current three terminal PNPN semiconductor switching device comprising (1) a wafer of silicon having a first and a second region of a first type semiconductivity separated by a region of a second type semiconductivity, the first and second regions of first type semiconductivity each having one surface contiguous and coextensive with opposite parallel surfaces of said region of second type semiconductivity, the first region of first type semiconductivity having a thickness of from 0.75 mil to 2.5 mils and the region of second type semiconductivity having a thickness of from 3 mils to 5 mils, (2) a p-n junction between each of the regions of first type semiconductivity and the region of second type semiconductivity, (3) an annular emitter of second type semiconductivity fused to another surface of the first region of first type semiconductivity, (4) a p-n junction between the emitter and the first region, (5) a base contact fused to the same surface of the first region as the emitter and centrally disposed within the area circumscribed by the emitter, (6) one surface of a metallic contact electrically joined to another surface of the second region of first type semiconductivity, (7) an ohmic solder disposed between said metallic contact and said another surface of the second region and joining one to the other, and (8) another surface of the metallic contact soldered to a metal case.

5. The high-current three terminal PNPN semiconductor switching device comprising (1) a wafer of silicon having a first and second region of a first type semiconductivity separated by a region of a second type semiconductivity, the first and second regions of first type semiconductivity each having one surface contiguous and coextensive with opposite parallel surfaces of said region of second type semiconductivity, the first region of first type semiconductivity having a thickness of from 0.75 mil to 2.5 mils and the region of second type semiconductivity having a thickness of from 3 mils to 5 mils, (2) a p-n junction between each of the regions of first type semiconductivity and the region of second type semiconductivity, (3) an annular emitter of second type semiconductivity fused to another surface of the first region of first type semiconductivity, (4) a p-n junction between the emitter and the first region, (5) a base contact fused to the same surface of the first region as the emitter and centrally disposed within the area circumscribed by the emitter, (6) one surface of a metallic contact electrically joined to another surface of the second region of first type semiconductivity, (7) an ohmic solder alloy disposed between said metallic contact and said another surface of the second region and joining one to the other, (8) another surface of the metallic contact soldered to a metal case, and (9) an annular metallic contact in electrical contact with the annular emitter.

6. A high-current three terminal PNPN semiconductor switching device comprising (1) a single crystal (111) oriented wafer of silicon, said silicon wafer having a central region of n-type semiconductivity and a top and a bottom region of p-type semiconductivity, said top, central and bottom regions each having a top and a bottom surface, (2) a first p-n junction within the wafer between the top surface of said central n-type region and the bottom surface of said top p-type region, (3) a second p-n junction within the wafer between the bottom surface of said central n-type region and the top surface of said bottom p-type region, (4) one surface of a metallic contact joined to the bottom surface of said p-type bottom region of the silicon wafer, said metallic contact comprised of a metal selected from the group consisting of molybdenum, tantalum and tungsten, (5) an aluminum boron acceptor alloy disposed between said bottom surface of the bottom p-n region of the silicon wafer and said one surface of the metallic contact which serves as a solder to join said silicon wafer and said metallic contact, (6) one surface of a metallic case joined to another surface of the metallic contact, (7) one surface of an annular n-type emitter comprised of 99.5%, by weight, gold and 0.5%, by weight, antimony fused to the top surface of said p-type top region of the silicon wafer, (8) a third p-n junction between the top surface of the p-type top region of the silicon wafer and the n-type emitter, (9) an annular metallic contact in intimate contact with another surface of said negative emitter, said annular metallic contact being comprised of at least one metal selected from the group consisting of molybdenum, tungsten and tantalum, (10) a p-type base contact comprised of a gold-boron alloy disposed centrally upon and in intimate contact with the top surface of said p-type top region of the silicon wafer within the area circumscribed by the n-type annular emitter, and (11) electrical leads intimately joined to the p-type base contact and the annular metallic contact.

7. A high-current three terminal PNPN semiconductor switching device comprising (1) a single crystal, (111) oriented wafer of silicon having a diameter of ⅜ inch and a thickness of from 0.005 inch to 0.008 inch, said silicon wafer having a central region of n-type semiconductivity having a thickness of 0.003 inch to 0.005 inch and a top and a bottom region of p-type semiconductivity each having a thickness of from 0.00075 to 0.0025 inch, said top, central, and bottom regions each having a top and a bottom surface, (2) a first p-n junction within the wafer between the top surface of said central n-type region and the bottom surface of said top p-type region, (3) a second p-n junction within the wafer between the bottom surface of said central n-type region and the top surface of said bottom p-type region, (4) one surface of a metallic contact joined to the bottom surface of said p-type bottom region of silicon wafer, said metallic contact having a diameter of at least ⅜ inch and a thickness of from 0.002 inch to 0.1 inch and comprised of a metal selected from the group consisting of molybdenum, tantalum, tungsten and alloys thereof, (5) an aluminum-boron acceptor alloy disposed between said bottom surface of the bottom p-type region of the silicon wafer and said one surface of the metallic contact, which acceptor alloy serves as a solder to join said silicon wafer and said metallic contact, (6) another surface of the metallic contact, opposite to the aforesaid one surface, coated with nickel, (7) one surface of a metallic case joined to said metallic coated surface of said metallic contact, said case being comprised of at least one metal selected from the group consisting of copper, aluminum, steel and base alloys thereof, (8) a layer of a silver base alloy solder disposed between and connecting said one surface of the case and the nickel coated surface of the metallic contact, (9) one surface of an annular n-type emitter comprised of 99.5%, by weight, gold and 0.5%, by weight, antimony having an outer diameter of 5/16 inch and an inner diameter of 0.09 inch fused to the top surface of said p-type region of silicon wafer, (10) a third p-n junction between the top surface of said p-type top region of the silicon wafer and said n-type emitter, (11) an annular metallic contact in intimate contact with another surface of said negative emitter, said annular metallic contact being comprised of at least one metal selected from the group consisting of molybdenum, tantalum, tungsten and alloys thereof, (12) a p-type base contact comprised of a gold-boron alloy disposed centrally upon and in intimate contact with the top surface of said p-type top region of the silicon wafer within the area circumscribed by the n-type annular emitter, and (13) electrical leads intimately joined to the p-type base contact and the annular metallic contact.

8. The switching device of claim 1, wherein the emitter is of an annular shape and the base contact is disposed within and spaced from the annular emitter.

References Cited in the file of this patent

UNITED STATES PATENTS

| | | |
|---|---|---|
| 2,779,877 | Lehovec | Jan. 29, 1957 |
| 2,910,634 | Rutz | Oct. 27, 1959 |

Disclaimer 2,980,832.—*Frank S. Stein*, and *Elmer W. Torok*, Greensburg, Pa. HIGH CURRENT NPNP SWITCH. Patent dated Apr. 18, 1961. Disclaimer filed Feb. 17, 1964, by the assignee, *Westinghouse Electric Corporation.*

Hereby enters this disclaimer to claim 1 of said patent.

[*Official Gazette May 12, 1964.*]

Notice of Adverse Decision in Interference

In Interference No. 92,040 involving Patent No. 2,980,832, F. S. Stein and E. W. Torok, High current NPNP switch, final judgment adverse to the patentees was rendered Mar. 26, 1963, as to claim 1.

[*Official Gazette October 27, 1964.*]